(12) United States Patent
Jacques et al.

(10) Patent No.: US 12,341,416 B2
(45) Date of Patent: Jun. 24, 2025

(54) CONTROLLER FOR POWER CONVERTER

(71) Applicant: RediSem Ltd., Hong Kong (CN)

(72) Inventors: Russell Jacques, Hong Kong (CN);
David Coulson, Hong Kong (CN);
Niek Van Der Duijn Schouten, Hong Kong (CN)

(73) Assignee: RediSem Ltd., Hong Kong (CN)

( * ) Notice: Subject to any disclaimer, the term of this patent is extended or adjusted under 35 U.S.C. 154(b) by 159 days.

(21) Appl. No.: 17/637,939

(22) PCT Filed: Sep. 17, 2019

(86) PCT No.: PCT/CN2019/106085
§ 371 (c)(1),
(2) Date: Feb. 24, 2022

(87) PCT Pub. No.: WO2021/051254
PCT Pub. Date: Mar. 25, 2021

(65) Prior Publication Data
US 2022/0278606 A1 Sep. 1, 2022

(51) Int. Cl.
*H02M 1/088* (2006.01)
*H02M 1/08* (2006.01)
(Continued)

(52) U.S. Cl.
CPC ............ *H02M 1/088* (2013.01); *H02M 1/08* (2013.01); *H02M 1/38* (2013.01);
(Continued)

(58) Field of Classification Search
CPC .......... H02M 1/38; H02M 1/08; H02M 1/088; H02M 3/33571
See application file for complete search history.

(56) References Cited

U.S. PATENT DOCUMENTS

| 4,298,925 A | * | 11/1981 | Melling | ............ | H02M 7/53832 |
| | | | | | 363/131 |
| 7,956,550 B2 | * | 6/2011 | Nerone | ................. | H02M 5/458 |
| | | | | | 315/291 |

(Continued)

FOREIGN PATENT DOCUMENTS

| CN | 102882510 A | 1/2013 |
| CN | 107306078 A | 10/2017 |

(Continued)

OTHER PUBLICATIONS

World Intellectual Property Organization, International Search Report and Written Opinion for international application No. PCT/CN2019/106085, mail date Jun. 6, 2020, 9 total pages.

(Continued)

*Primary Examiner* — Alex Torres-Rivera
(74) *Attorney, Agent, or Firm* — SoCal IP Law Group LLP; Mark Andrew Goldstein

(57) ABSTRACT

A controller for a power converter having at least a first switch and a second switch. Each switch is a transistor with a collector terminal, an emitter terminal, and a base terminal. The controller is connectable to the base terminals of the first and second switches to provide a base current to the base terminals of the first and second switches, and connectable to the emitter terminals of the first and second switches to provide a short-circuit between the base and emitter terminals of the first and second switches. The controller also comprises a timing circuit for controlling the provision of the base current and the short-circuit in a sequence. An associated method is also provided.

19 Claims, 14 Drawing Sheets

(51) Int. Cl.
    *H02M 1/38*     (2007.01)
    *H02M 3/335*     (2006.01)
    *H02M 3/00*     (2006.01)

(52) U.S. Cl.
    CPC ... *H02M 3/33569* (2013.01); *H02M 3/33571* (2021.05); *H02M 3/01* (2021.05)

(56) References Cited

U.S. PATENT DOCUMENTS

| | | | |
|---|---|---|---|
| 2009/0167081 A1* | 7/2009 | Chen | H02M 1/08 307/31 |
| 2013/0200929 A1 | 8/2013 | Sawada et al. | |
| 2014/0063883 A1* | 3/2014 | Familiant | H02M 1/38 363/131 |
| 2018/0159440 A1 | 6/2018 | Xu et al. | |

FOREIGN PATENT DOCUMENTS

| | | |
|---|---|---|
| CN | 107800423 A | 3/2018 |
| CN | 108233684 A | 6/2018 |
| EP | 2248252 | 11/2020 |
| JP | 2005304218 A | 10/2005 |
| JP | 2008199037 A | 8/2008 |
| WO | 2009095649 A1 | 8/2009 |
| WO | 2021051254 A1 | 3/2021 |

OTHER PUBLICATIONS

India Intellectual Property Organization, First Examination Report for Application No. 202217022524, mail date Jun. 26, 2024, 5 total pages.

* cited by examiner

PRIOR ART

CONTROLLER FOR POWER CONVERTER

RELATED APPLICATION INFORMATION

This patent claims priority from International PCT Patent Application No. PCT/CN2019/106085, filed Sep. 17, 2019 entitled, "CONTROLLER FOR POWER CONVERTER", which is incorporated herein by reference in its entirety.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

FIELD

The invention relates to controllers for and methods of controlling power converters, and in particular, switched-mode power converters based on bridge topologies such as half-bridge converters, but the invention is not limited to these particular uses.

BACKGROUND

Referring to FIG. 1, prior U.S. Pat. No. 9,219,428 shows a low-cost lighting ballast based on a controlled self-oscillating half-bridge resonant switching topology. This topology uses two low-cost bipolar switches in a half-bridge arrangement, whose base-emitter junctions are mutually coupled by windings on a base drive transformer. The base drive transformer is an integral part of the self-oscillating design, providing not only mutual coupling but also galvanic isolation of the base drives for the top-side and bottom-side BJTs. A control winding is provided on the base drive transformer to enable frequency control through connection of a regulating controller. Though widely used, one drawback to this arrangement is the size and cost of the base drive transformer.

Referring to FIG. 2, prior U.S. Pat. No. 7,956,550 shows a self-oscillating non-regulating converter based on two complementary BJTs and a base drive transformer with a tuned circuit to set the operating frequency. Again, one drawback to this arrangement is the size and cost of the base drive transformer.

It is an object of the present invention to overcome or ameliorate at least one of the disadvantages of the prior art, or to provide a useful alternative.

It is an object of some embodiments of the present invention to provide a controller of reduced size and cost without sacrificing the performance or control functions provided by a controller having a base drive transformer.

SUMMARY

Embodiments of the present invention in a first aspect provide a controller for a power converter having at least a first switch and a second switch, each switch being a transistor with a collector terminal, an emitter terminal, and a base terminal, the controller connectable to the base terminals of the first and second switches to provide a base current to the base terminals of the first and second switches, and connectable to the emitter terminals of the first and second switches to provide a short-circuit between the base and emitter terminals of the first and second switches, the controller comprising a timing circuit for controlling the provision of the base current and the short-circuit in a sequence.

In one embodiment, the controller comprises:
a first terminal for connection to the base terminal of the first switch;
a second terminal for connection to the base terminal of the second switch;
a third terminal for connection to the emitter terminals of the first and second switches;
the controller adapted to provide positive base current pulses to the first terminal, the positive base current pulses being returned from the third terminal;
the controller adapted to provide negative base current pulses to the second terminal, the negative base current pulses being returned from the third terminal;
the controller adapted to provide a short-circuit between the first and third terminals;
the controller adapted to provide a short-circuit between the second and third terminals; and
the timing circuit controlling the sequence of the provision of the positive and negative current pulses and the short-circuits.

In one embodiment, the first and second terminals are interconnected.

In one embodiment, the controller comprises:
a positive supply terminal for connection to a positive supply input;
a negative supply terminal for connection to a negative supply input;
a first shunt regulator connected between the positive supply terminal and the third terminal;
a second shunt regulator connected between the negative supply terminal and the third terminal.

In one embodiment, the first shunt regulator directs shunted current to the first terminal, and the second shunt regulator directs shunted current to the second terminal.

In one embodiment, the controller comprises:
a positive supply terminal for connection to a positive supply input;
a negative supply terminal for connection to a negative supply input;
wherein the power converter comprises a transformer having:
a main winding connected in series with the third terminal;
an auxiliary winding connected in series with a resistor to an input of a dual rectifier circuit having a positive output connected to the positive supply terminal and a negative output connected to the negative supply terminal.

In one embodiment, the power converter comprises at least a first diode and a second diode, the first and second diodes being free-wheel diodes, and wherein:
a cathode of the first diode is connected to the collector terminal of the first switch;
an anode of the first diode is connected to the emitter terminal of the first switch;
a cathode of the second diode is connected to the emitter terminal of the second switch; and
an anode of the second diode is connected to the collector terminal of the second switch.

In one embodiment, the controller comprises:

a signal terminal for receiving a current sense signal;

a comparator circuit for comparing the current sense signal to one of two turn-on current thresholds selected alternately by the timing circuit; and the timing circuit being responsive to an output of the comparator circuit.

In one embodiment, the first and second switches are bipolar junction transistors (BJTs). In one embodiment, the first switch is a NPN BJT and the second switch is a PNP BJT.

Embodiments of the present invention in a second aspect provide a method of controlling a power converter having at least a first switch and a second switch, each switch being a transistor with a collector terminal, an emitter terminal, and a base terminal, the method comprising:

turning on the first and second switches with a base current; and turning off the first and second switches with a short-circuit between the base and emitter terminals of the first and second switches.

In one embodiment, the first and second switches are turned on alternately with a base current or a respective base current.

In one embodiment, the first and second switches are turned off alternately with a short-circuit between the respective base and emitter terminals of the first and second switches or with a respective short-circuit between the respective base and emitter terminals of the first and second switches.

In one embodiment, the emitter terminals of the first and second switches are interconnected. In one embodiment, the base terminals of the first and second switches are interconnected.

In one embodiment, the method comprises providing a controller for turning the first and second switches on and off. In one embodiment, the controller turns the first and second switches on and off in a sequence.

In one embodiment, power is supplied to the controller through an auxiliary winding of a transformer.

In one embodiment, a current provided by the controller is shunt-regulated. In one embodiment, the first and second switches are turned on by the shunt-regulated current.

In one embodiment, one or more of the base currents provided to the first and second switches is adjusted to correct any imbalance between the first and second switches.

In one embodiment, one or more turn-on thresholds for a respective base current provided to the first and second switches is adjusted to correct any imbalance between the first and second switches.

In one embodiment, a timing for providing the base currents and/or the short-circuits to the first and second switches is adjusted to correct any imbalance between the first and second switches.

Other features and embodiments of the present invention can be found in the appended claims.

Throughout this specification, including the claims, the words "comprise", "comprising", and other like terms are to be construed in an inclusive sense, that is, in the sense of "including, but not limited to", and not in an exclusive or exhaustive sense, unless explicitly stated otherwise or the context clearly requires otherwise.

DESCRIPTION OF THE DRAWINGS

Preferred embodiments in accordance with the best mode of the present invention will now be described, by way of example only, with reference to the accompanying figures, in which the same reference numerals refer to like parts throughout the figures unless otherwise specified, and in which.

DETAILED DESCRIPTION OF PREFERRED EMBODIMENTS OF THE INVENTION

Figure 1:
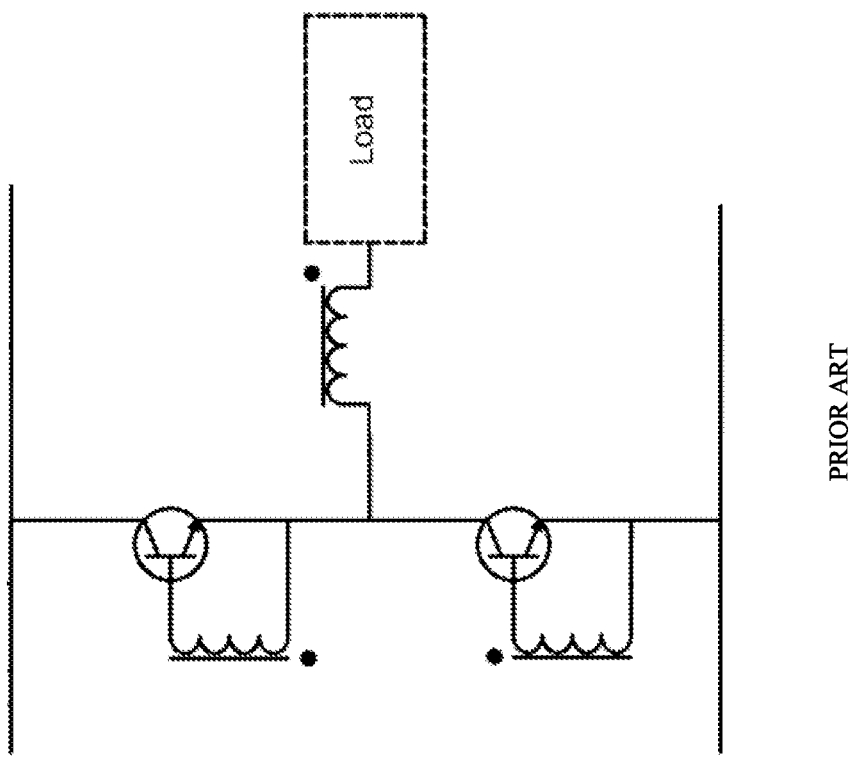
FIG. 1 is a schematic diagram of a self-oscillating half-bridge switched-mode power converter using BJTs with a base drive transformer in accordance with prior U.S. Pat. No. 9,219,428.
Figure 1:
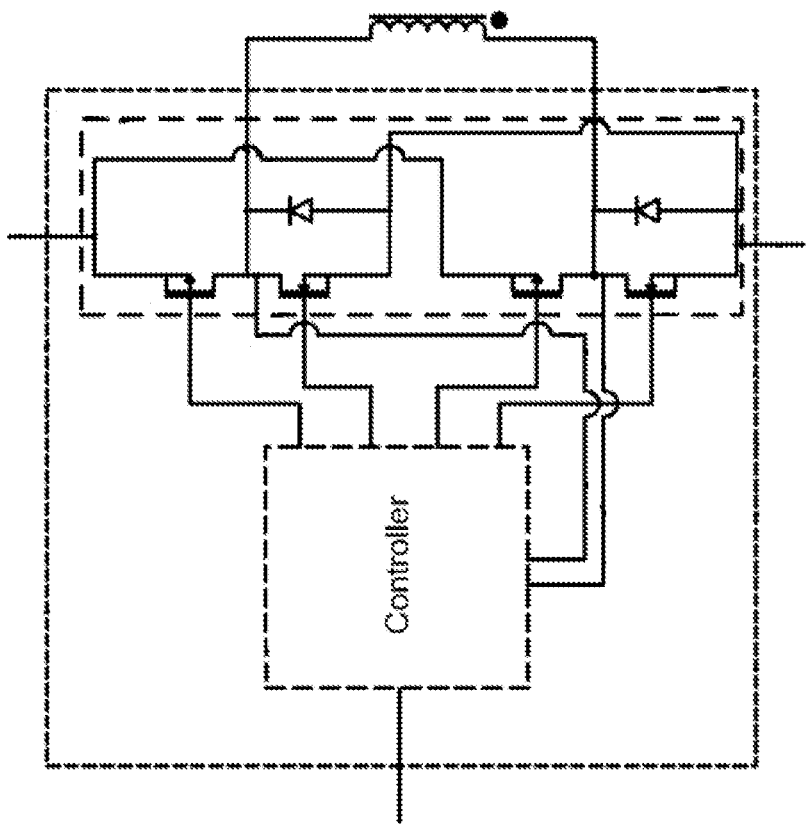
Figure 2:
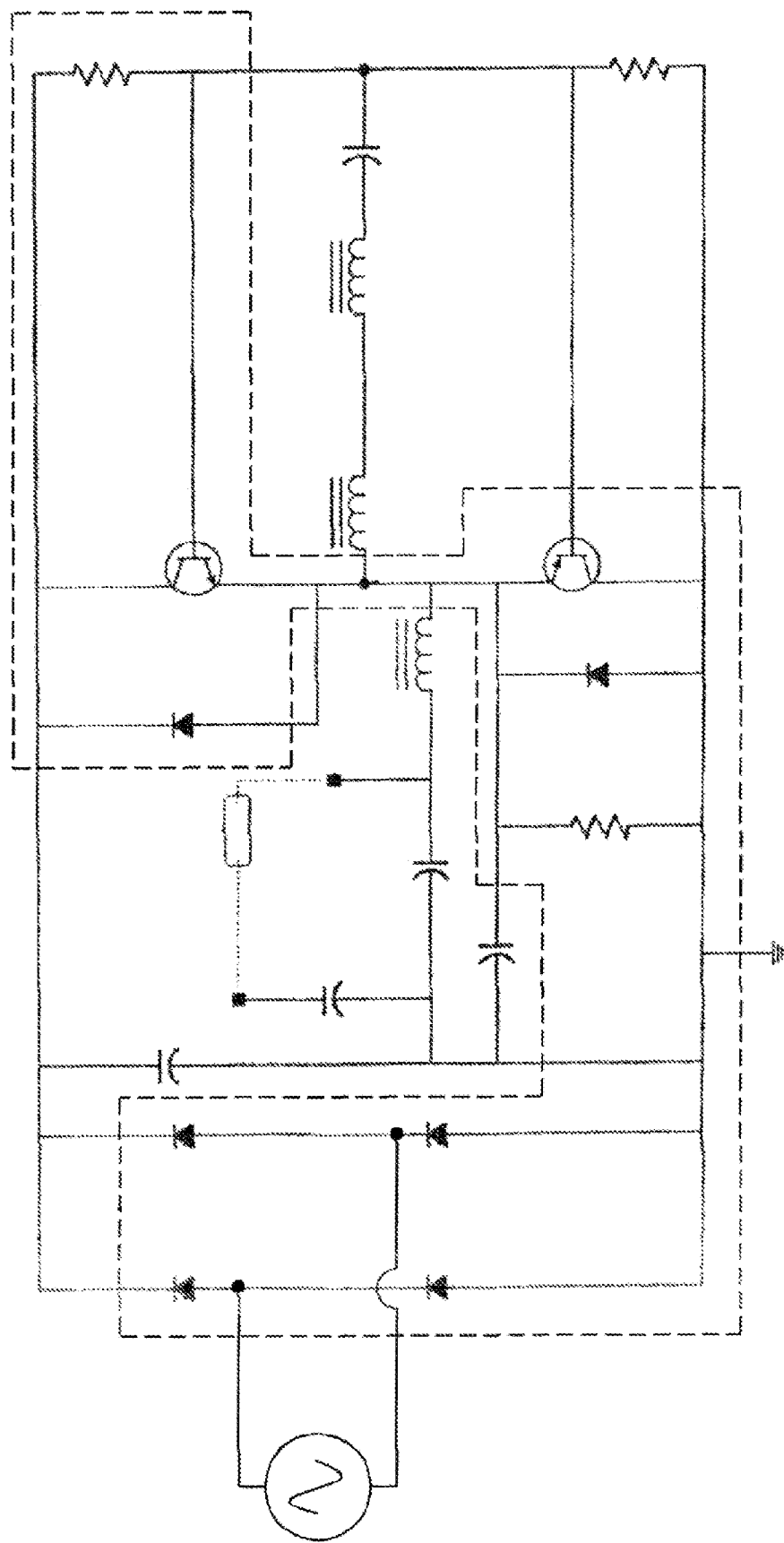
FIG. 2 is a schematic diagram of a self-oscillating half-bridge switched-mode power converter using complementary BJTs with a base drive transformer in accordance with prior U.S. Pat. No. 7,956,550.

Referring to the figures, there is provided a controller 1 for a power converter 2 having at least a first switch Q1 and a second switch Q2. Each switch Q1 and Q2 is a transistor with a collector terminal 3, an emitter terminal 4, and a base terminal 5. The controller 1 is connectable to the base terminals 5 of the first and second switches Q1 and Q2 to provide a base current 6 to the base terminals of the first and second switches, and connectable to the emitter terminals 4 of the first and second switches Q1 and Q2 to provide a short-circuit between the base 5 and emitter 4 terminals of the first and second switches. The controller 1 also comprises a timing circuit 25 for controlling the provision of the base current 6 and the short-circuit in a sequence.

In the particular embodiment shown in the figures, the controller 1 comprises a first terminal 7 for connection to the base terminal 5 of the first switch Q1, and a second terminal 8 for connection to the base terminal 5 of the second switch Q2. The controller 1 comprises a third terminal 9 for connection to the emitter terminals 4 of the first Q1 and second Q2 switches. The controller 1 is adapted to provide positive base current pulses to the first terminal 7, with the positive base current pulses being returned from the third terminal 9. The controller 1 is also adapted to provide negative base current pulses to the second terminal 8, with the negative base current pulses being returned from the third terminal 9. The controller 1 is further adapted to provide a short-circuit between the first 7 and third 9 terminals, and to provide a short-circuit between the second 8 and third 9 terminals. The timing circuit 25 controls the sequence of the provision of the positive and negative current pulses and the short-circuits.

The first Q1 and second Q2 switches in the present embodiment are bipolar junction transistors (BJTs). More specifically, the first switch Q1 is a NPN BJT and the second switch Q2 is a PNP BJT.

In some of the embodiments shown in the figures, the first 7 and second 8 terminals are interconnected. However, in other embodiments, this does not have to be the case. Similarly, in other embodiments, the emitter terminals 4 of the first Q1 and second Q2 switches can be separately connected to the controller 1, instead of being interconnected as is the case in the embodiments shown in the figures.

In some embodiments, the controller 1 comprises a positive supply terminal 10 (V+) for connection to a positive supply input, and a negative supply terminal 12 (V−) for connection to a negative supply input. In these embodiments, the power converter 2 comprises a transformer T1 having a main winding W2 connected in series with the third terminal 9. An auxiliary winding W1 is connected in series with a resistor R1 to an input of a dual rectifier circuit 16 having a positive output 17 connected to the positive supply terminal 10 (V+) and a negative output 18 connected to the negative supply terminal 12 (V−). The auxiliary winding W1, resistor R1, and dual rectifier circuit 16 form at least part of an auxiliary supply circuit.

In some embodiments, the controller 1 also comprises a first shunt regulator 14 connected between the positive supply terminal 10 and the third terminal 9. The controller 1 can also comprise a second shunt regulator 15 connected between the negative supply terminal 12 and the third terminal 9. The controller 1 can be further adapted so that the first shunt regulator 14 directs the shunted current to the first terminal 7 and the second shunt regulator 15 directs the shunted current to the second terminal 8, whereby the resistor R1 substantially determines the current supplied to the first and second switches Q1 and Q2.

In some embodiments, the power converter 2 comprises at least a first diode D3 and a second diode D4, where the first and second diodes are free-wheel diodes. A cathode 19 of the first diode D3 is connected to the collector terminal of the first switch Q1 (and also, in this embodiment, to the positive HT+ supply terminal 11), and an anode 20 of the first diode D3 is connected to the emitter terminal of the first switch Q1 (and also, in this embodiment, to the third terminal 9). A cathode 21 of the second diode D4 is connected to the emitter terminal of the second switch Q2 (and also, in this embodiment, to the third terminal 9), and an anode 22 of the second diode D4 is connected to the collector terminal of the second switch Q2 (and also, in this embodiment, to the negative HT− supply terminal 13).

In some embodiments, the controller 1 comprises a signal terminal 23 for receiving a current sense signal. A comparator circuit 24 compares the current sense signal to one of two turn-on current thresholds selected alternately by the timing circuit. The timing circuit 25 is responsive to an output of the comparator circuit 24.

Embodiments of the present invention also provide a method of controlling a power converter 2 having at least a first switch Q1 and a second switch Q2. Each switch Q1 and Q2 is a transistor with a collector terminal 3, an emitter terminal 4, and a base terminal 5. An embodiment of the method comprises turning on the first Q1 and second Q2 switches with a base current 6, and turning off the first Q1 and second Q2 switches with a short-circuit between the base 5 and emitter 4 terminals of the first and second switches.

In some embodiments, the first Q1 and second Q2 switches are turned on alternately with a base current 6 or a respective base current 6, that is, the base currents 6 provided to the first Q1 and second Q2 switches can be the same base current or different base currents. The first Q1 and second Q2 switches are turned off alternately with a short-circuit between the respective base 5 and emitter 4 terminals of the first Q1 and second Q2 switches or with a respective short-circuit between the respective base 5 and emitter 4 terminals of the first Q1 and second Q2 switches.

The emitter terminals 4 of the first Q1 and second Q2 switches can be interconnected. The base terminals 5 of the first Q1 and second Q2 switches can be interconnected.

In the embodiments shown in the figures, a controller 1 turns the first Q1 and second Q2 switches on and off. More specifically, the controller 1 turns the first Q1 and second Q2 switches on and off in a sequence.

In some embodiments, power is supplied to the controller 1 through an auxiliary winding W1 of a transformer T1 and a current provided by the controller 1 is shunt-regulated.

In one embodiment, the first Q1 and second Q2 switches are turned on by the shunt-regulated current.

In one embodiment, one or more of the base currents 6 provided to the first Q1 and second Q2 switches is adjusted to correct any imbalance between the first and second switches.

In another embodiment, one or more turn-on thresholds for a respective base current 6 provided to the first Q1 and second Q2 switches is adjusted to correct any imbalance between the first and second switches.

In a further embodiment, a timing for providing the base currents 6 and/or the short-circuits to the first Q1 and second Q2 switches is adjusted to correct any imbalance between the first and second switches.

Figure 3:
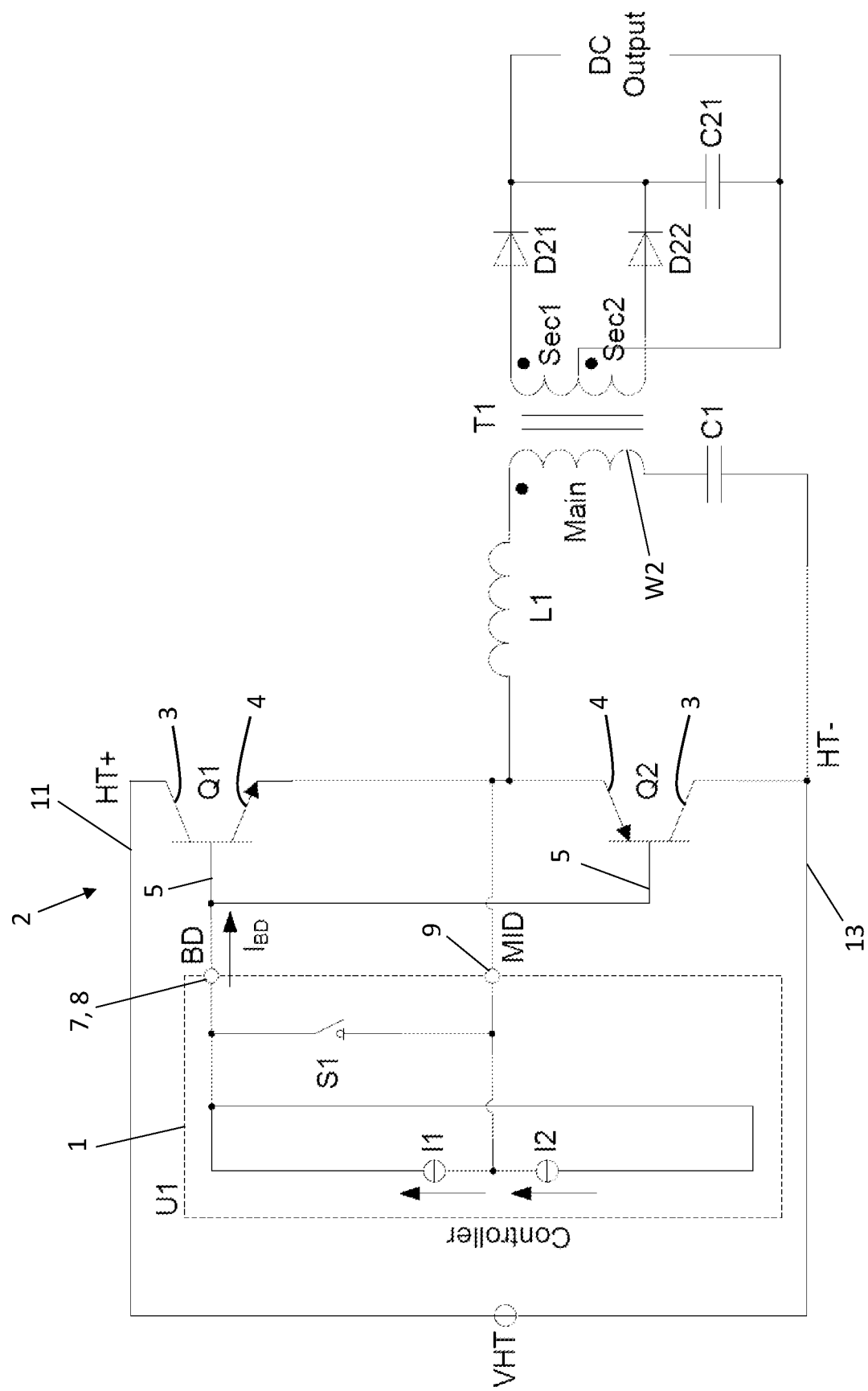
FIG. 3 is a schematic diagram of a half-bridge switched-mode power converter using complementary BJTs with interconnected base terminals and a controller comprising two current sources I1, I2, and a switch S1 in accordance with an embodiment of the present invention.

Considering FIG. 3 in more detail, FIG. 3 shows a schematic circuit diagram of a simple embodiment of the present invention. FIG. 3 depicts the basic components of a direct-drive half-bridge power converter using BJTs. NPN BJT Q1 and PNP BJT Q2 are connected in series to form a half-bridge between voltage rails HT+ and HT−, that is, the positive HT supply terminal 11 (HT+) and the negative HT supply terminal 13 (HT−) respectively. The primary winding W2 of transformer T1 is connected between the half-bridge and the capacitor C1. Clamping switch S1 is connected between the emitter 4 and base 5 terminals of the BJTs Q1 and Q2. Switchable current source I1 is connected between the emitter 4 and base 5 terminals of Q1. Similarly, switchable current source 12 is connected between emitter 4 and base 5 terminals of Q2.

Figure 4:
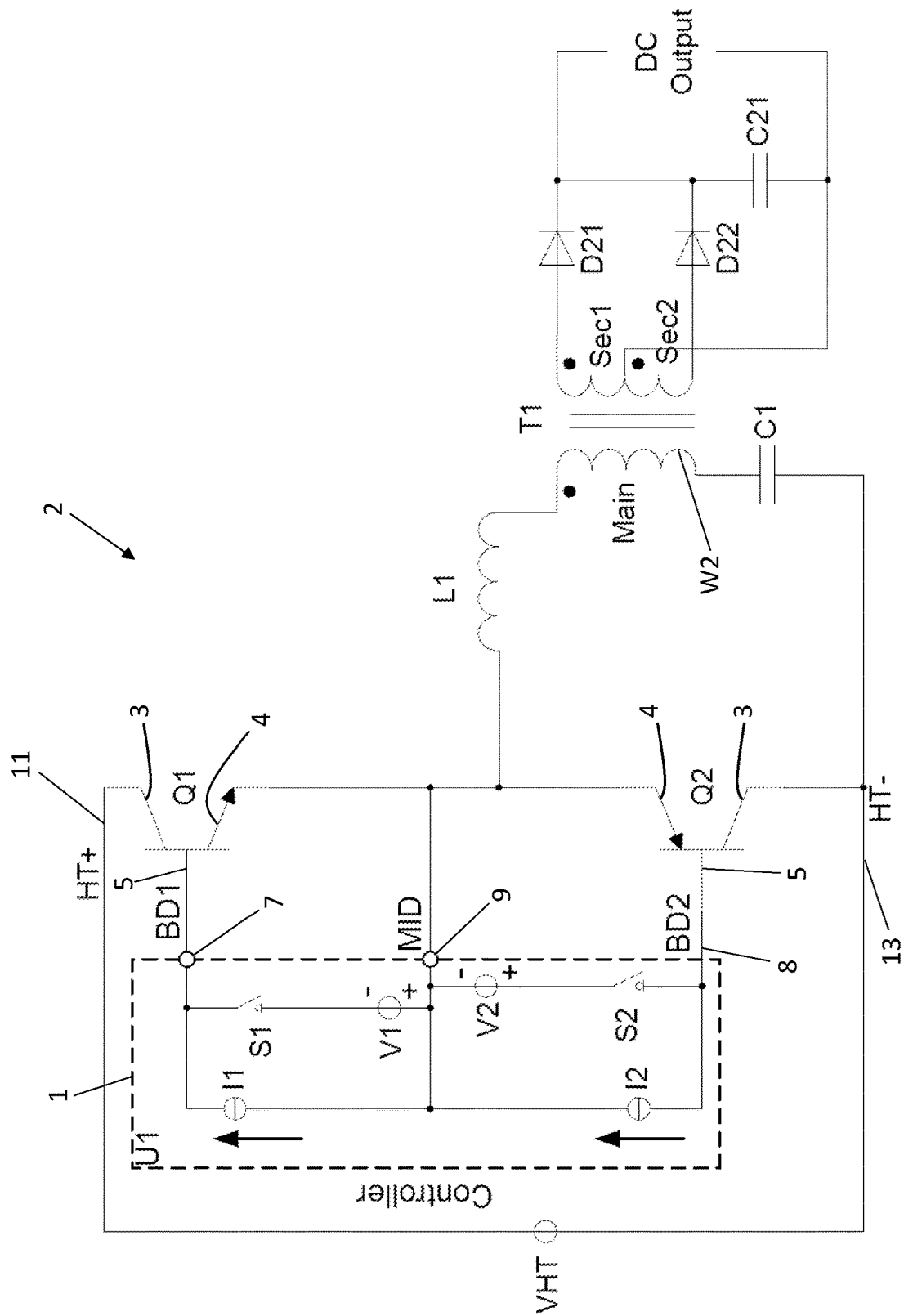
FIG. 4 is a schematic diagram of a half-bridge switched-mode power converter using complementary BJTs with separated base terminals and a controller comprising two current sources I1, I2, and a switch S1 in accordance with another embodiment of the present invention.

An alternative arrangement uses separated base clamping switches, allowing voltage and/or current sources to switch off the BJTs faster, thus achieving lower switching losses. The arrangement of FIG. 4 shows two base clamping switches S1 and S2, each connected in series with a voltage source, V1 and V2 respectively. By these means, a reverse base-emitter voltage is applied to remove the base charge more aggressively, in order to provide a means for turning off each BJT faster.

Figure 7:
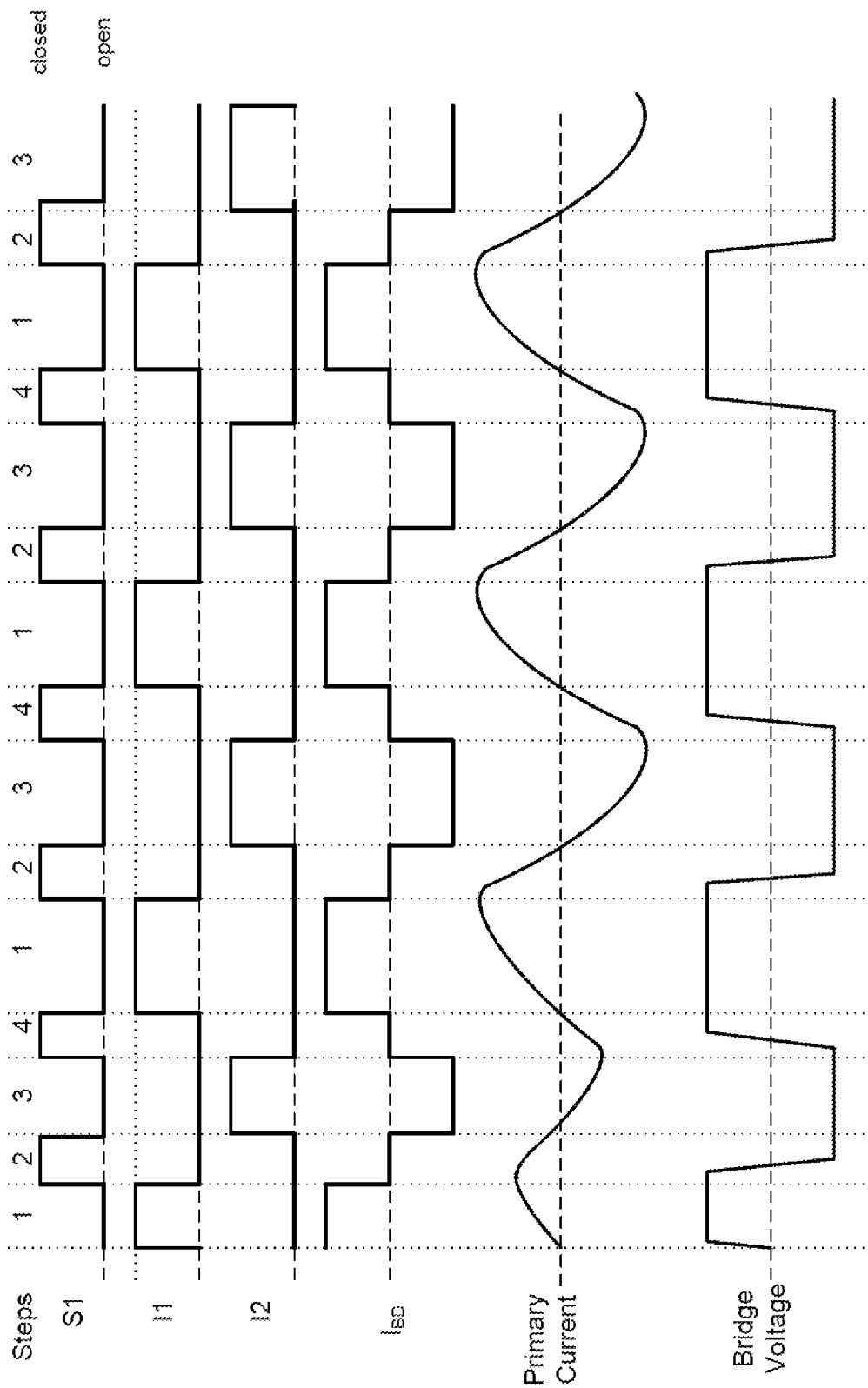
FIG. 7 are exemplary timing waveforms of an embodiment of the present invention that uses a four-step timing sequence.

The power conversion sequence is a repeating sequence of four steps, as shown in FIG. 7. More particularly, the steps involve the following.

Step 1: switch Si is opened, and current source I1 is turned on, charging the base 5 of Q1, thereby turning on Q1.

Step 2: switch Si is closed, shorting out the base-emitter junction (a short-circuit between the base 5 and emitter 4) of Q1, thereby turning off Q1.

Step 3: switch Si is opened, and current source 12 is turned on, charging base 5 of Q2, thereby turning on Q2.

Step 4: switch Si is closed, shorting out the base-emitter junction (a short-circuit between the base 5 and emitter 4) of Q2, thereby turning off Q2.

Figure 9:
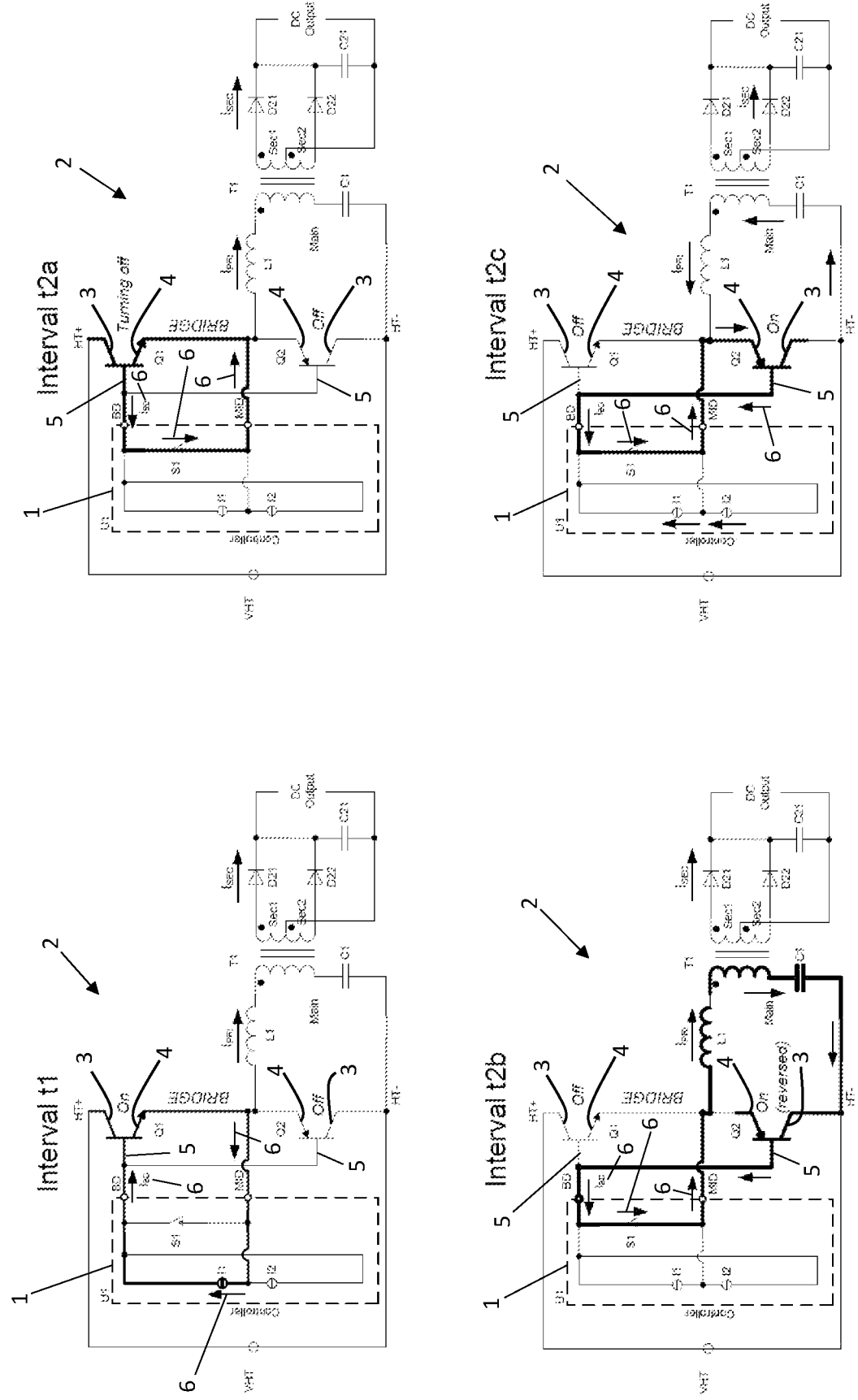
FIG. 9 are schematic diagrams of the embodiment of FIG. 3 showing the BJT base current paths based on a four-step timing sequence as shown in FIG. 8.

The effects of this control sequence are now described in greater detail. FIG. 9 shows the paths of the base current 6 in the circuit for Steps 1 and 2. The paths of the base current 6 for Steps 3 and 4 are not shown as these are complementary to Steps 1 and 2 and can be easily appreciated therefrom.

The timing intervals t1, t2a, t2b, t2c, t3, t4a, t4b, and t4c indicated in the figures are described below.

Interval t1:

Primary current passes through a pre-defined turn-on current threshold $I_{TH1}$ (this defines the start of Step 1). Current source I1 is turned on, supplying current $I_{BD}$ to the base of Q1. Note that Q1 Is already turned on because the base of Q1 is full of charge from the reverse conduction in the previous intervals t4b and t4c. Q1 collector-emitter saturation is maintained by the $I_{BD}$ base current. The bridge voltage is clamped to the HT+ supply voltage.

Interval t2a:

Switch S1 is closed, current flows out of the base 5 of Q1, rapidly removing base charge, thereby turning it off. The series inductor (L1 in the primary circuit) continues to draw current, which drives the bridge voltage sharply negative.

Interval t2b:

The bridge voltage undershoots the HT− supply voltage, so that Q2 collector-base junction is forward-biased and conducts current, clamping the bridge to HT−. During this interval, Q2 base-emitter is reverse-biased, therefore Q2 is operating in reverse-conduction mode. The large base current fills Q2 base-collector junction with charge, which ensures that Q2 is heavily saturated by the end of this interval.

Interval t2c:

Q2 base is full of charge from the previous interval. Since the collector-emitter current is now close to zero, most of the base charge is retained and Q2 maintains saturation. The bridge voltage is held at the HT− supply voltage.

Interval t3:

The primary current passes through a pre-defined turn-on current threshold ITH2 (this defines the start of Step 3). Note that the base is full of charge from the reverse conduction in the previous intervals t2b and t2c. Q2 collector-emitter saturation is maintained by the IBD base current. The bridge voltage is held at the HT− supply voltage.

Interval t4a:

Switch Si is closed, rapidly removing base charge from Q2, thereby turning it off. The series inductor (L1 in the primary circuit) continues to source current, which drives the bridge voltage sharply positive.

Interval t4b:

The bridge voltage overshoots the HT+ supply voltage, so that Q1 collector-base junction is forward-biased and conducts current, clamping the bridge to HT+. During this interval, Q1 base-emitter is reverse-biased, therefore Q1 is operating in reverse-conduction mode. The large base current fills Q1 base-collector junction with charge, which ensures that Q1 is heavily saturated by the end of this interval.

Interval t4c:

Q1 base is full of charge from the previous interval. Since the collector-emitter current is now close to zero, most of the base charge is retained and Q1 maintains saturation. The bridge voltage is held at the HT+ supply voltage.

Figure 10:
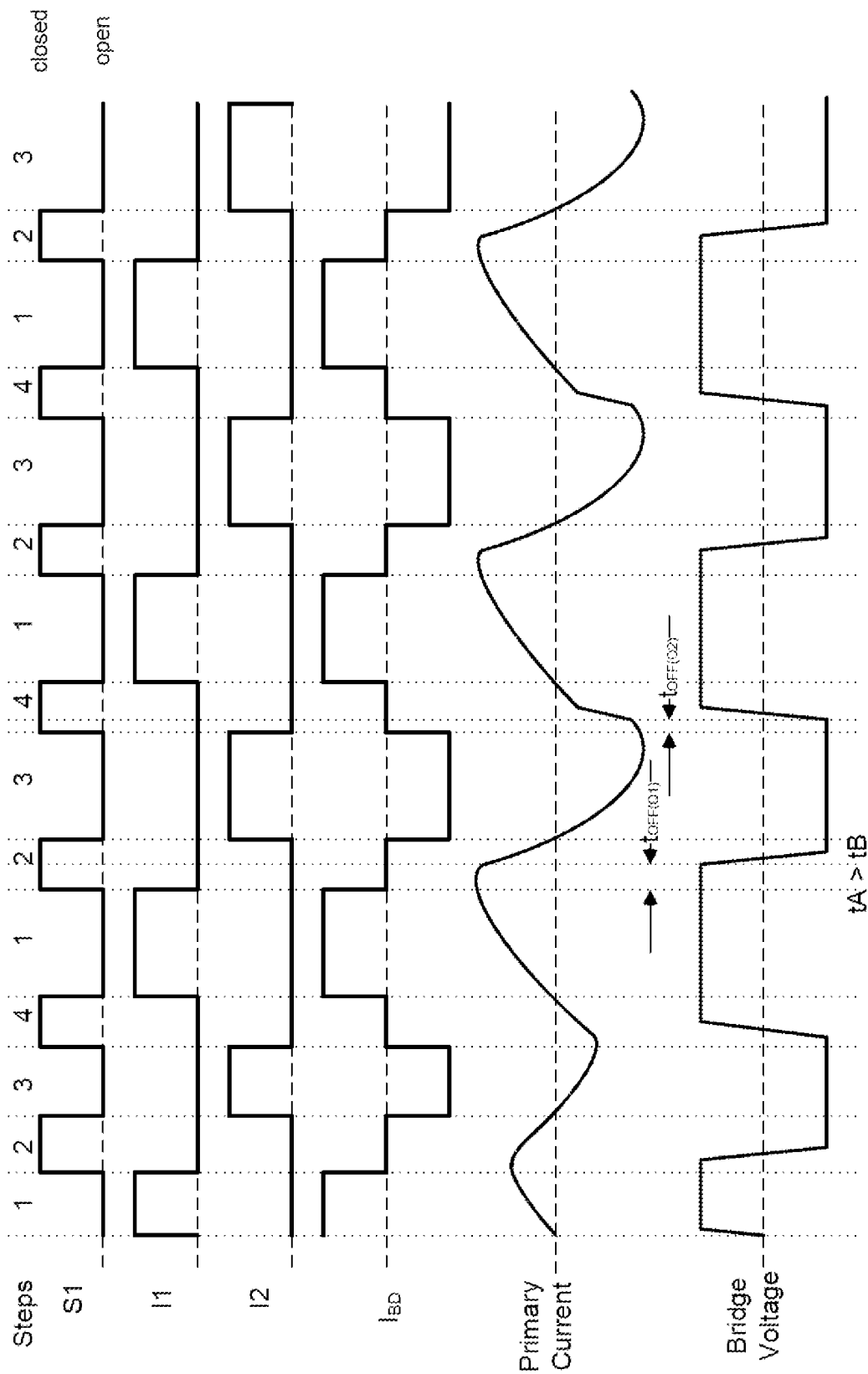
FIG. 10 are exemplary timing waveforms of an embodiment of the present invention where the bridge formed by the switches is imbalanced since the turn-off times of the switches are substantially different.

In cases where the complementary BJTs Q1 and Q2 are not well-matched, the turn-off delays can be very different, potentially resulting in imbalanced bridge waveforms, excessive heat dissipation, reduced efficiency and even unstable operation. For example, FIG. 10 shows waveforms for a converter 2 in which the complementary BJTs Q1 and Q2 are not well-matched. In this case, comparing the turn-off times for Q1 and Q2, $t_{OFF(Q1)}$ is greater than $t_{OFF(Q2)}$ which results in current and voltage waveforms which are visibly imbalanced.

The BJT turn-off time is dependent on the amount of base charge present when the turn-off clamp S1 is applied. This is dependent on the base charge injected by the current sources during the turn-on intervals, Steps 1 and 3. Additionally, the BJT turn-off time is also strongly dependent on the base charge injected during the preceding turn-off clamping interval after the bridge voltage has commutated. For Q1, charge is injected into the base in the interval t4b. For Q2, charge is injected into the base in the interval t2b.

Figure 11:
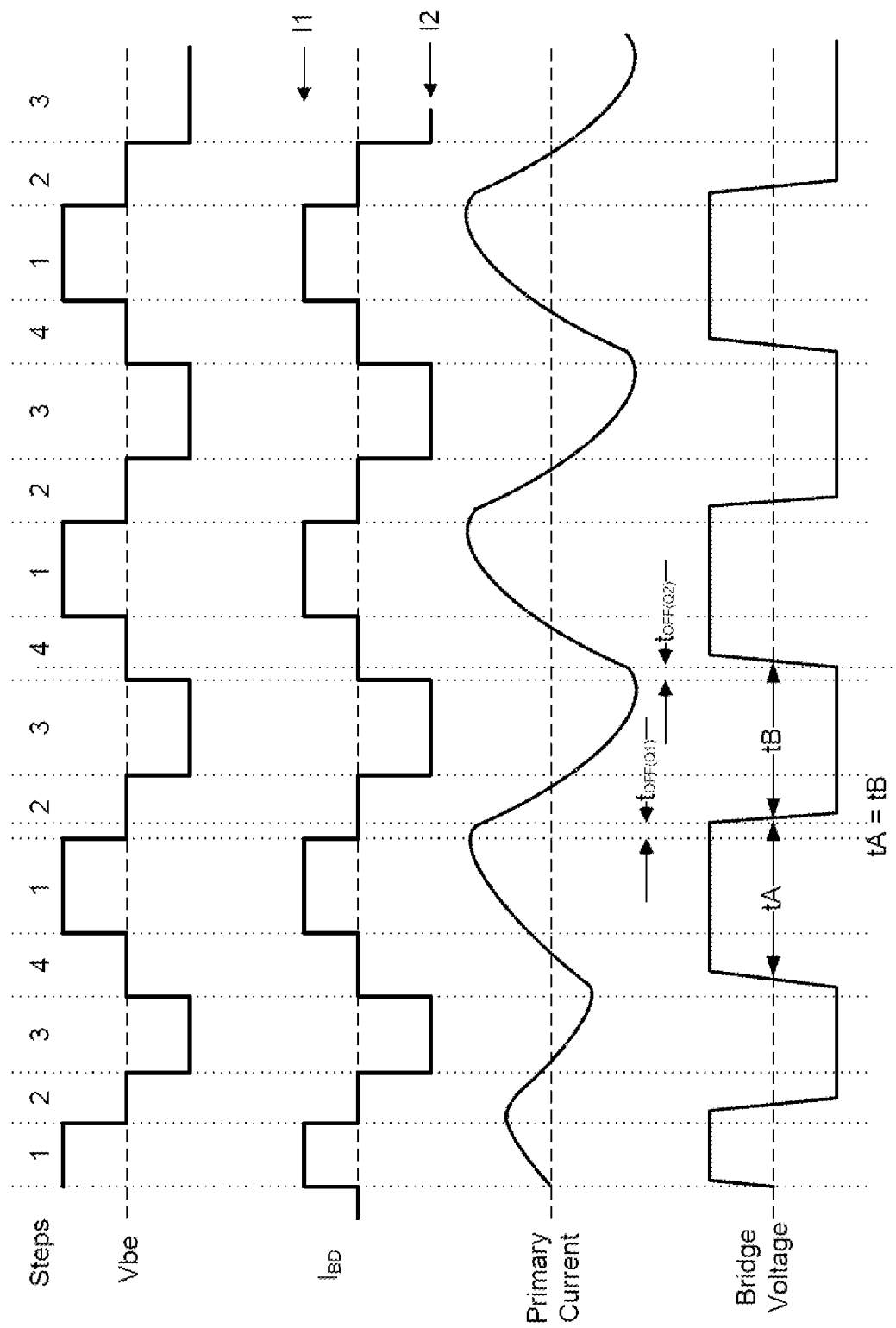
FIG. 11 are timing waveforms of the embodiment of FIG. 10 where the bridge imbalance is corrected by a first correction method.

To compensate for the imbalance, a first method works by modifying the current provided by the turn-on current sources I1 and I2. The method adjusts the base current and, therefore, the level of BJT saturation to improve the matching of the BJT turn-off times. FIG. 11 gives an example of this method of imbalance correction by modifying the turn-on current source I1 to be less than I2.

Figure 12:
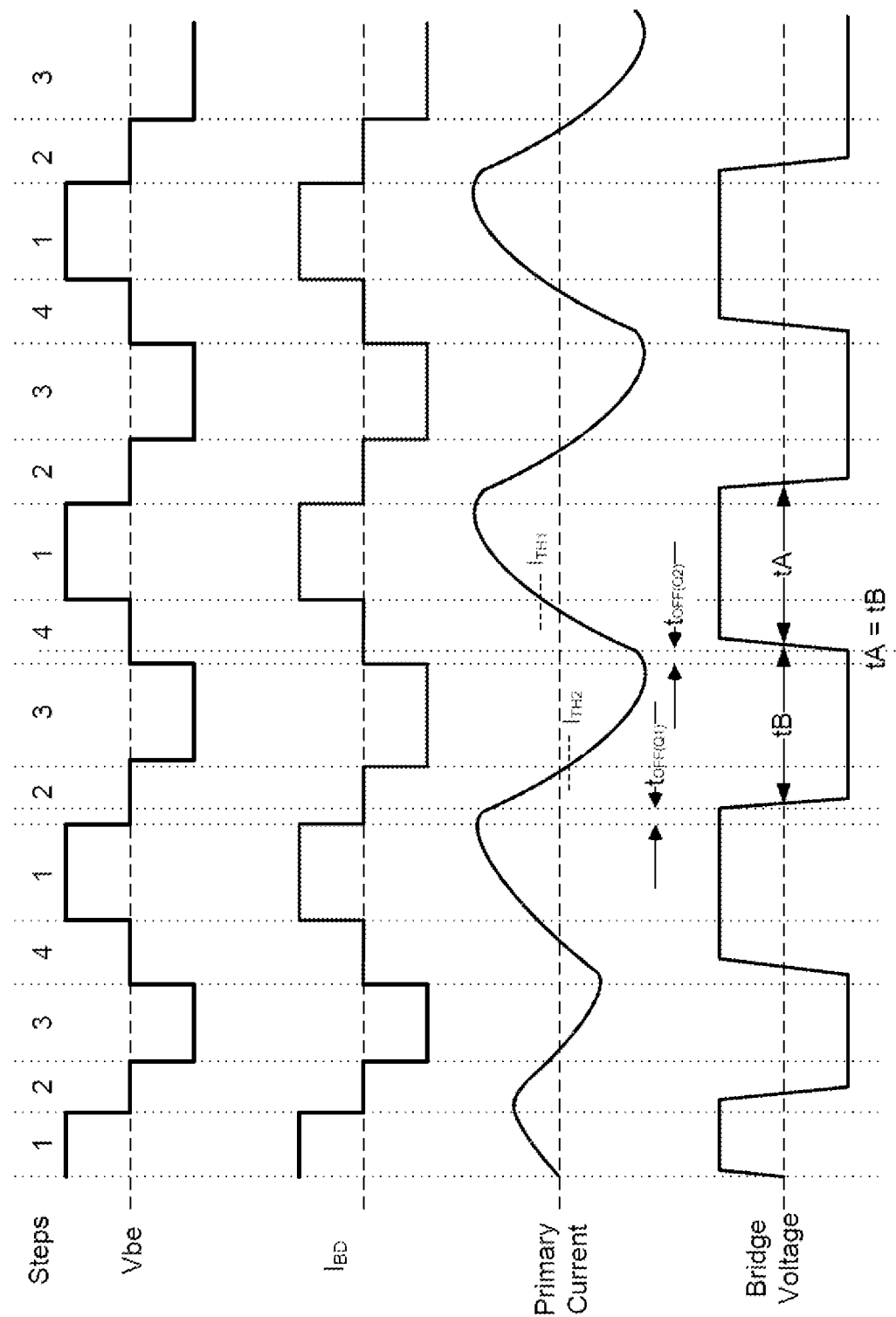
FIG. 12 are timing waveforms of the embodiment of FIG. 10 where the bridge imbalance is corrected by a second correction method.

A second method of compensating for bridge imbalance works by modifying the timing of the start of Steps 1 and 3. The method adjusts the turn-on current threshold levels of $I_{TH1}$ and $I_{TH2}$ (which define the start of Steps 1 and 3, respectively) which, in turn, adjusts the injected base charge, thereby adjusting also the level of BJT saturation and finally adjusting the turn-off times to rebalance the bridge switching waveforms. FIG. 12 gives an example of this method of imbalance correction by modifying the turn-on current threshold $I_{TH1}$ to be greater than $I_{TH2}$.

Figure 13:
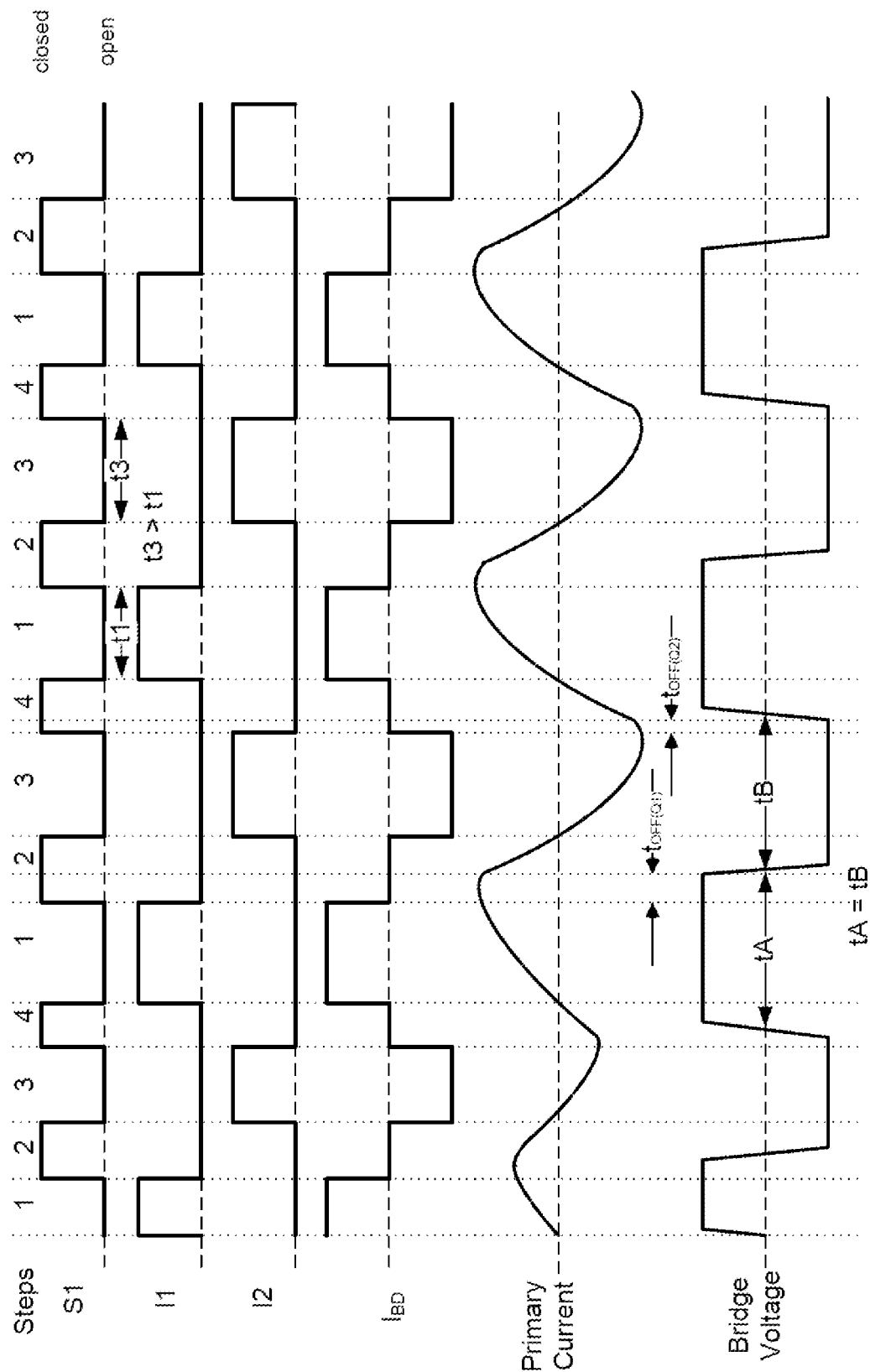
FIG. 13 are timing waveforms of the embodiment of FIG. 10 where the bridge imbalance is corrected by a third correction method.

A third method works by modifying the step timings to be asymmetric. For example, FIG. 13 shows the case where Q1 turns off faster than Q2. By shortening Step 1, the actual Q1 turn-off timing can be adjusted to cancel out the bridge imbalance. Note that this third compensation method differs from the others in that it works by modifying only the timings and does not significantly modify the levels of BJT saturation.

Figure 8:
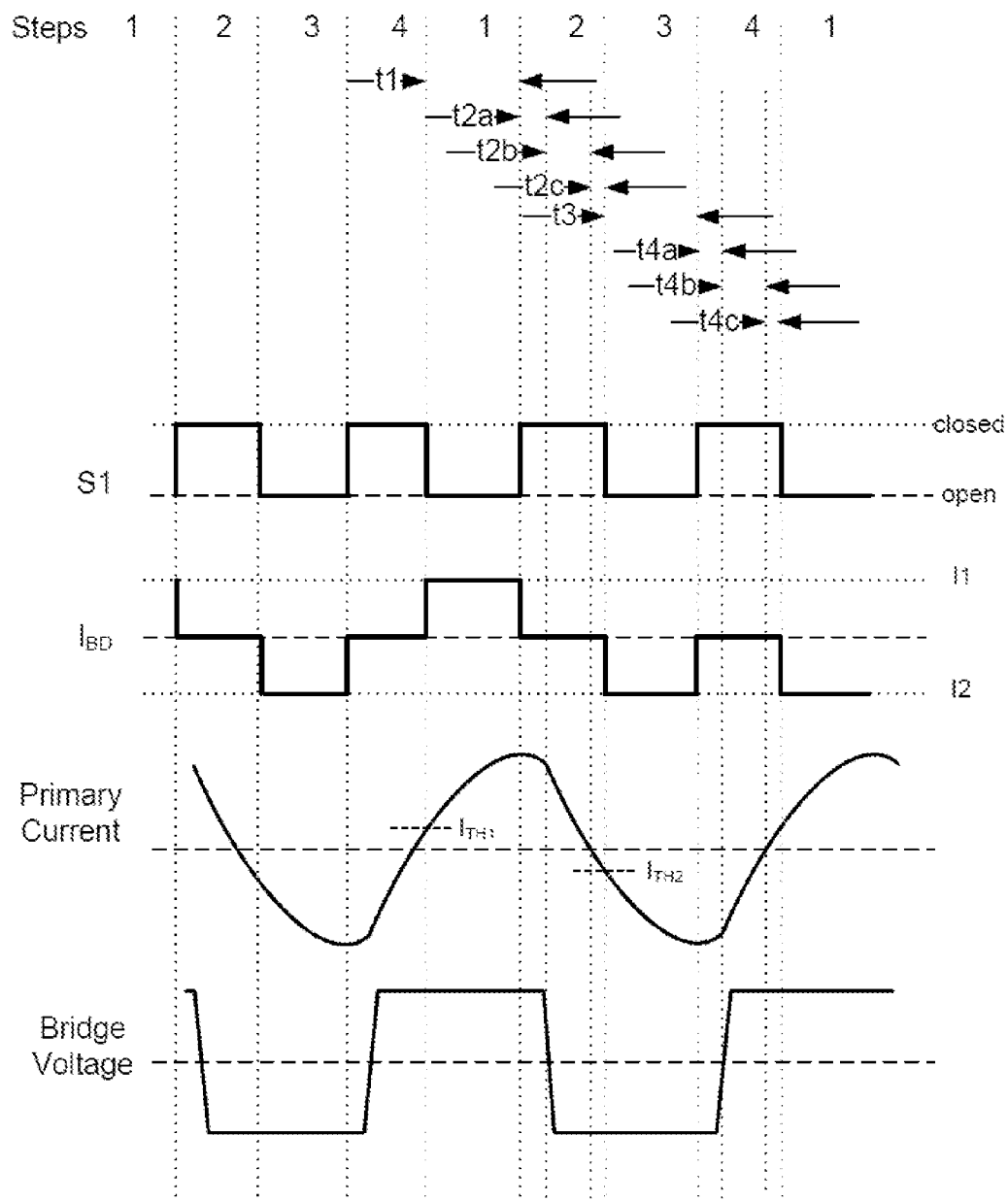
FIG. 8 are the timing waveforms of FIG. 7 shown with additional timing details.
Figure 14:
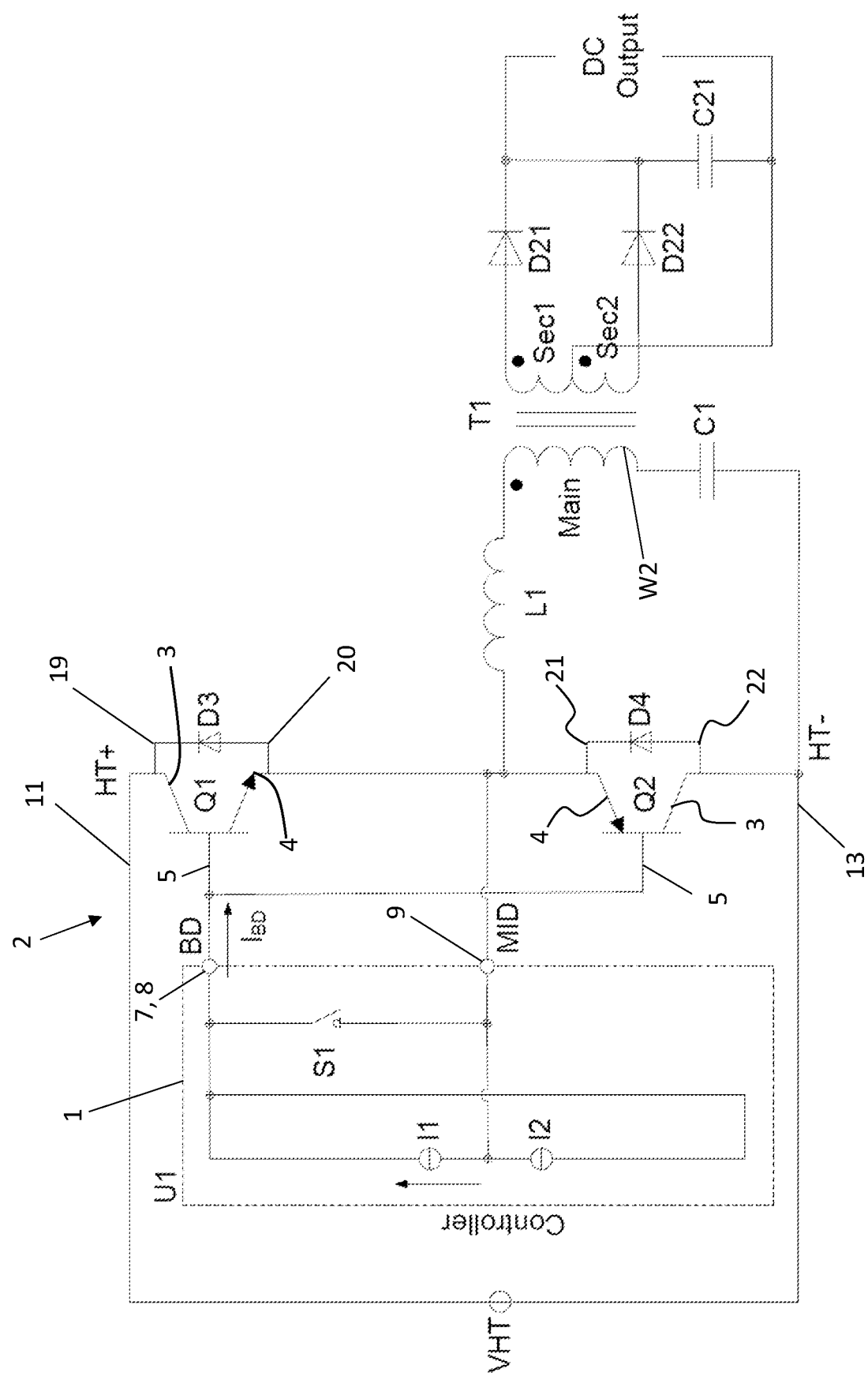
FIG. 14 is a schematic diagram of the embodiment of FIG. 3 shown with free-wheel diodes D3 and D4 connected across the complementary BJTs Q1 and Q2.

Referring in particular to FIG. 8, when Si is closed at Step 2, the charge in the base-emitter region is removed through S1, causing Q1 to switch off after time delay interval t2a. The inductance of L1 causes the primary current to continue flowing after Q1 switches off, so that the bridge voltage falls rapidly until it drops below the negative supply rail HT− at the start of interval t2b. At this point, most of the primary current flows into Q2 collector, out of Q2 base and through S1, as shown in FIG. 9. Switching into this reversed mode, the Q2 base-collector junction typically takes about one microsecond to achieve full conduction. Due to this delay, the bridge voltage will typically undershoot the voltage of the negative supply rail HT−, aggravating the switching losses and RF emissions. These undesirable effects may be mitigated by adding fast turn-on free-wheel diodes across the collector-emitter junctions of each BJT (see diodes D3 and D4 shown in FIG. 14) to clamp the overshoot.

Figure 5:
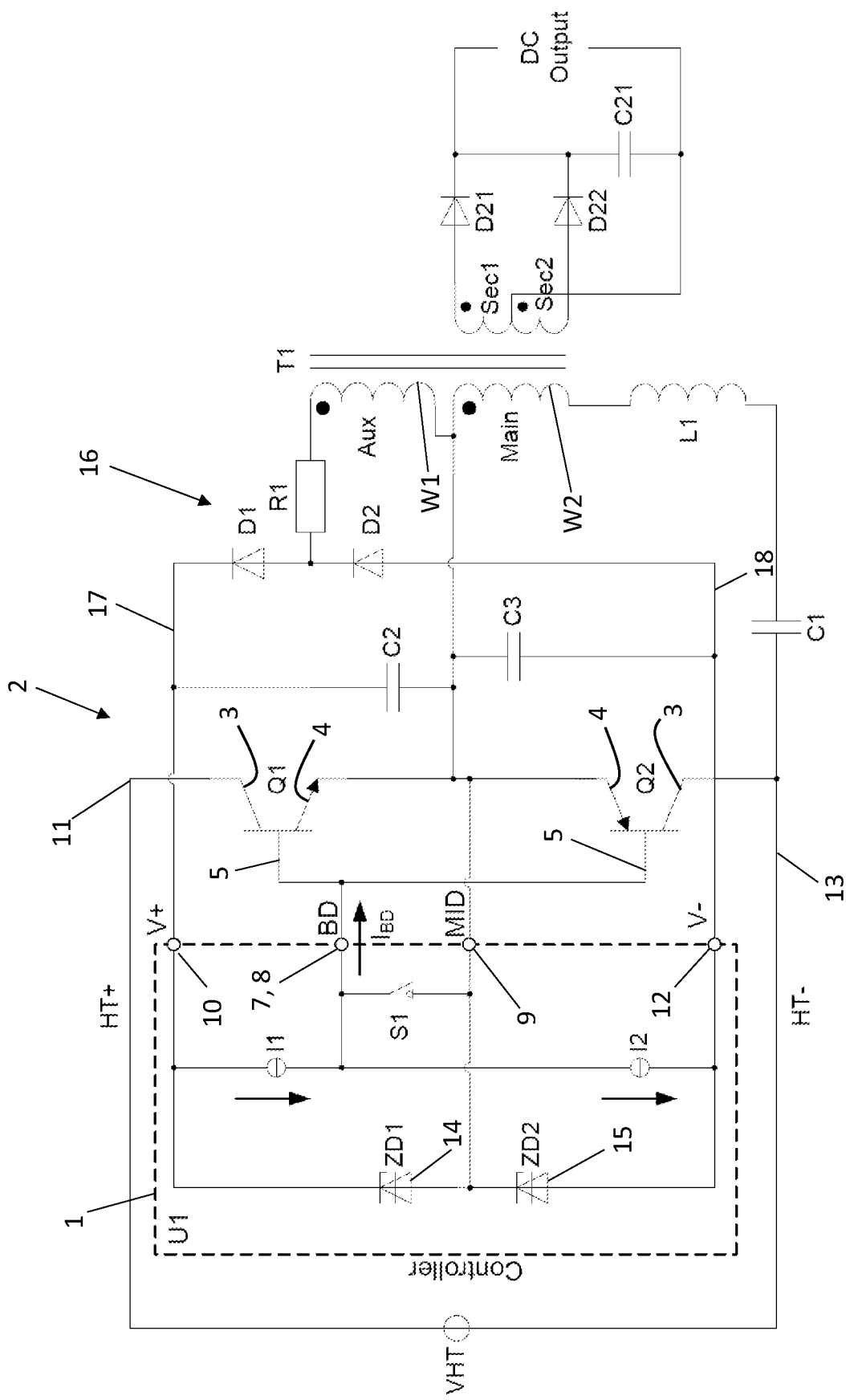
FIG. 5 is a schematic diagram of the embodiment of FIG. 3 shown with an auxiliary winding providing rectified power to the controller, and the controller further including dual shunt regulators.

A controller 1 and supply circuit capable of providing the drive method according to an embodiment of the present invention is shown in FIG. 5. The controller 1 (U1) comprises switch S1, and current sources I1 and I2. The supply circuit comprises an auxiliary winding W1 on transformer T1 in series with current limiting resistor R1, connected between the junction of the emitters 4 of Q1 and Q2 and a dual rectifier circuit 16 comprising diodes D1 and D2. The anode of D1 is connected to the positive supply terminal V+ of U1, and the cathode of D2 is connected to the negative supply terminal V− of U1. The voltage induced in W1 is in phase with the voltage developed on main winding W2 of T1 so that power is delivered to U1 when base current 6 is required, which allows the values of the supply decoupling capacitors C2 and C3 to be advantageously minimized. The voltage generates an alternating current through R1 which is rectified by diodes D1 and D2 to produce a positive voltage on terminal V+ of U1 and a negative voltage on terminal V− of U1. Optionally, zener diodes ZD1 and ZD2 or equivalent shunt regulators may be used to provide voltage limiting for the positive supply terminal 10 (V+) and negative supply terminal 12 (V−).

Figure 6:
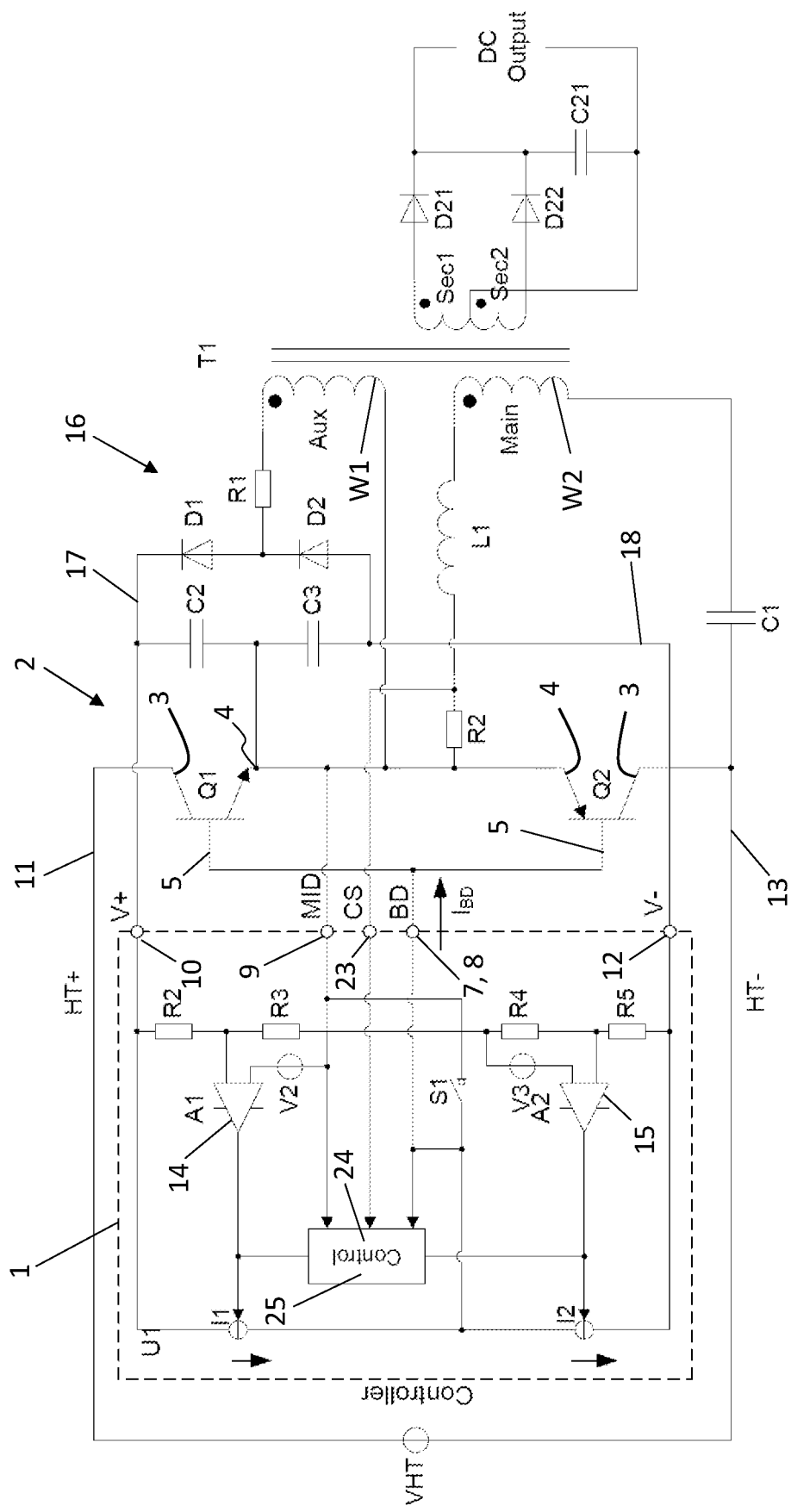
FIG. 6 is a schematic diagram of the embodiment of FIG. 3 shown with an auxiliary winding providing rectified power to the controller, and the controller further including dual shunt regulators which direct shunted current to a base drive output of the controller BD.

FIG. 6 shows a controller 1 supplied by power rectified from the auxiliary winding W1, in which the positive and negative supply terminals V+ and V− are shunt regulated by amplifiers A1 and A2 operating on current sources I1 and I2, respectively, which direct the excess current to the BD node. The current drawn from the auxiliary winding W1 is determined by the value of R1. In this way, the base drive current 6 to Q1 and Q2 is ultimately determined by the value of R1.

Considering the problem of bridge imbalance described earlier, a degree of inherent self-balancing can be achieved by using the circuits of FIG. 5 and FIG. 6. The rectified supply rails V+ and V− vary in response to the bridge imbalance. By connecting the auxiliary winding W1 in the correct phase with respect to the primary winding W2, the base drive current 6 can be rebalanced, modifying the storage times of Q1 and Q2 to compensate for the original bridge imbalance.

It is also appreciated that the aforesaid embodiments are only exemplary embodiments adopted to describe the principles of the present invention, and the present invention is not merely limited thereto. Various variants and modifications can be made by those of ordinary skill in the art without departing from the spirit and essence of the present invention, and these variants and modifications are also covered within the scope of the present invention. Accordingly, although the invention has been described with reference to specific examples, it is appreciated by those skilled in the art that the invention can be embodied in many other forms. It is also appreciated by those skilled in the art that the features of the various examples described can be combined in other combinations.

It is claimed:

1. A controller for a power converter having at least a first switch and a second switch, each switch being a transistor with a collector terminal, an emitter terminal, and a base terminal, the controller connectable to the base terminals of the first and second switches to provide a base current to the base terminals of the first and second switches, and connectable to the emitter terminals of the first and second switches to provide a short-circuit between the base and emitter terminals of the first and second switches, the emitter terminals of the first and second switches being joined together to provide the short-circuit between the base and emitter terminals of the first and second switches, the controller comprising a clamping switch connected between the emitter and base terminals of the first and second switches and closeable to provide the short-circuit between the base and emitter terminals of the first and second switches, and a timing circuit for controlling the provision of the base current and the short-circuit in a sequence, the controller further comprising:
a first terminal for connection to the base terminal of the first switch;
a second terminal for connection to the base terminal of the second switch;
a third terminal for connection to the emitter terminals of the first and second switches;
the controller adapted to provide positive base current pulses to the first terminal, the positive base current pulses being returned from the third terminal;
the controller adapted to provide negative base current pulses to the second terminal, the negative base current pulses being returned from the third terminal;
the controller adapted to provide a short-circuit between the first and third terminals;
the controller adapted to provide a short-circuit between the second and third terminals; and
the timing circuit controlling the sequence of the provision of the positive and negative current pulses and the short-circuits.

2. The controller according to claim 1 wherein the first and second terminals are interconnected.

3. The controller according to claim 1 further comprising:
a positive supply terminal for connection to a positive supply input;
a negative supply terminal for connection to a negative supply input;
a first shunt regulator connected between the positive supply terminal and the third terminal;
a second shunt regulator connected between the negative supply terminal and the third terminal.

4. The controller according to claim 3 wherein:
the first shunt regulator directs shunted current to the first terminal;
the second shunt regulator directs shunted current to the second terminal.

5. The controller according to claim 1 further comprising:
a positive supply terminal for connection to a positive supply input;
a negative supply terminal for connection to a negative supply input;
wherein the power converter comprises a transformer having:
a main winding connected in series with the third terminal;

an auxiliary winding connected in series with a resistor to an input of a dual rectifier circuit having a positive output connected to the positive supply terminal and a negative output connected to the negative supply terminal.

6. The controller according to claim 1 wherein the power converter comprises at least a first diode and a second diode, the first and second diodes being free-wheel diodes, and wherein:
a cathode of the first diode is connected to the collector terminal of the first switch;
an anode of the first diode is connected to the emitter terminal of the first switch;
a cathode of the second diode is connected to the emitter terminal of the second switch; and
an anode of the second diode is connected to the collector terminal of the second switch.

7. The controller according to claim 1 further comprising:
a signal terminal for receiving a current sense signal;
a comparator circuit for comparing the current sense signal to one of two turn-on current thresholds selected alternately by the timing circuit; and
the timing circuit being responsive to an output of the comparator circuit.

8. The controller according to claim 1 wherein the first and second switches are bipolar junction transistors (BJTs), and the first switch is a NPN BJT and the second switch is a PNP BJT.

9. A method of controlling a power converter having at least a first switch and a second switch, each switch being a transistor with a collector terminal, an emitter terminal, and a base terminal, the emitter terminals of the first and second switches being joined together to provide a short-circuit between the base and emitter terminals of the first and second switches, the method comprising:
turning on the first and second switches with a base current; and
turning off the first and second switches with a short-circuit between the base and emitter terminals of the first and second switches by closing a clamping switch connected between the emitter and base terminals of the first and second switches, wherein the emitter terminals of the first and second switches are joined together to provide the short-circuit.

10. The method according to claim 9 wherein the first and second switches are turned on alternately with a base current or a respective base current.

11. The method according to claim 9 wherein the first and second switches are turned off alternately with a short-circuit between the respective base and emitter terminals of the first and second switches or with a respective short-circuit between the respective base and emitter terminals of the first and second switches.

12. The method according to claim 9 wherein the emitter terminals of the first and second switches are interconnected.

13. The method according to claim 9 wherein the base terminals of the first and second switches are interconnected.

14. The method according to claim 9 further comprising providing a controller for turning the first and second switches on and off in a sequence.

15. The method according to claim 14 wherein a current provided by the controller is shunt-regulated.

16. The method according to claim 15 wherein the first and second switches are turned on by the shunt-regulated current.

17. The method according to claim 9 wherein one or more of the base currents provided to the first and second switches is adjusted to correct any imbalance between the first and second switches.

18. The method according to claim 9 wherein one or more turn-on thresholds for a respective base current provided to the first and second switches is adjusted to correct any imbalance between the first and second switches.

19. The method according to claim 9 wherein a timing for providing the base currents and/or the short-circuits to the first and second switches is adjusted to correct any imbalance between the first and second switches.

* * * * *